US012709799B2

(12) United States Patent
Nishida et al.

(10) Patent No.: US 12,709,799 B2
(45) Date of Patent: Aug. 18, 2026

(54) SUBSTRATE PROCESSING APPARATUS, METHOD OF PROCESSING SUBSTRATE, METHOD OF MANUFACTURING SEMICONDUCTOR DEVICE, RECORDING MEDIUM, AND EXHAUST SYSTEM

(71) Applicant: Kokusai Electric Corporation, Tokyo (JP)

(72) Inventors: Masaya Nishida, Toyama (JP); Tomohiko Kadosaki, Toyama (JP); Fumie Ando, Toyama (JP); Kenichi Maeda, Toyama (JP); Yosuke Kuwata, Toyama (JP); Fumikazu Takeuchi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 394 days.

(21) Appl. No.: 18/453,584

(22) Filed: Aug. 22, 2023

(65) Prior Publication Data

US 2023/0392257 A1 Dec. 7, 2023

Related U.S. Application Data

(63) Continuation of application No. PCT/JP2022/007518, filed on Feb. 24, 2022.

(30) Foreign Application Priority Data

Feb. 24, 2021 (JP) ................................ 2021-027405

(51) Int. Cl.
*C23C 16/44* (2006.01)
*C23C 16/455* (2006.01)
(Continued)

(52) U.S. Cl.
CPC .... *C23C 16/4412* (2013.01); *C23C 16/45561* (2013.01); *C23C 16/52* (2013.01); *H10P 14/6334* (2026.01); *H10P 14/69433* (2026.01)

(58) Field of Classification Search
CPC .......... C23C 16/4412; C23C 16/45561; C23C 16/52; H01L 21/0217; H01L 21/02271; H10P 14/69433
(Continued)

(56) References Cited

U.S. PATENT DOCUMENTS 9,133,836 B2 9/2015 Bailey
2015/0292082 A1 10/2015 Sano et al.
(Continued)

FOREIGN PATENT DOCUMENTS

CN 107541717 A 1/2018
JP H0261068 A 3/1990
(Continued)

OTHER PUBLICATIONS

Taiwanese Office Action for Taiwanese Patent Application No. 110149365 dated Nov. 16, 20200.
(Continued)

*Primary Examiner* — Phuc T Dang
(74) *Attorney, Agent, or Firm* — Volpe Koenig

(57) ABSTRACT

There is provided a technique that includes: a first gas supply line configured to supply a first gas to a substrate in a process chamber; a first exhaust line connected to a first pump and exhausting the first gas supplied to the substrate; a first valve installed at the first exhaust line; a second gas supply line configured to supply a second gas to the substrate in the process chamber; a second exhaust line connected to a second pump and exhausting the second gas supplied to the substrate; a second valve installed at the second exhaust line; and a controller capable of controlling the first valve and the
(Continued)

second valve, so as to perform a first line change processing of exhausting the first gas supplied to the substrate toward the second pump via the second exhaust line, when determining that the first exhaust line transitioned into a predetermined state.

19 Claims, 7 Drawing Sheets

(51) Int. Cl.
*C23C 16/52* (2006.01)
*H10P 14/60* (2026.01)
*H10P 14/694* (2026.01)

(58) Field of Classification Search
USPC .......................................................... 438/791
See application file for complete search history.

(56) References Cited

U.S. PATENT DOCUMENTS

2015/0292083 A1 10/2015 Franken et al.
2017/0372890 A1* 12/2017 Horiike ............. C23C 16/45544
2020/0385868 A1 12/2020 Kim et al.

FOREIGN PATENT DOCUMENTS

JP 2010-284592 A 12/2010
JP 2014-060327 A 4/2014
JP 2015-204461 A 11/2015
JP 2015-227618 A 12/2015
JP 2019-186574 A 10/2019
TW 201541517 A 11/2015

OTHER PUBLICATIONS

International Search report for International Patent Application No. PCT/JP2022/007518 dated Apr. 19, 2022.
Taiwanese Office Action for Taiwanese Patent Application No. 110149365 dated Nov. 15, 2022.
Taiwanese Office Action for Taiwanese Patent Application No. 110149365 dated Nov. 16, 2020.
Extended European Search Report issued on Jun. 27, 2025 for European Patent Application No. 22759699.
Chinese Office Action issued on Apr. 10, 2026, for Chinese Patent Application No. 202280010533.0.

* cited by examiner

SUBSTRATE PROCESSING APPARATUS, METHOD OF PROCESSING SUBSTRATE, METHOD OF MANUFACTURING SEMICONDUCTOR DEVICE, RECORDING MEDIUM, AND EXHAUST SYSTEM

CROSS-REFERENCE TO RELATED APPLICATION

This application is a Bypass Continuation Application of PCT International Application No. PCT/JP2022/007518, filed Feb. 24, 2022, the international application being based upon and claiming the benefit of priority from Japanese Patent Application No. 2021-027405, filed on Feb. 24, 2021, the entire contents of which are incorporated herein by reference.

TECHNICAL FIELD

The present disclosure relates to a substrate processing apparatus, a method of processing a substrate, a method of manufacturing a semiconductor device, a recording medium, and an exhaust system.

BACKGROUND

In the related art, as a substrate processing apparatus which is used in a process of manufacturing a semiconductor device, for example, there is a substrate processing apparatus that includes: a first exhaust system configured to exhaust a precursor from an interior of a process chamber; and a second exhaust system configured to exhaust a reactant from the interior of the process chamber, and is configured to reduce a maintenance frequency of the exhaust systems.

SUMMARY

The present disclosure provides a technique capable of preventing characteristic deterioration of process results even in a case where a desired process condition may not be obtained depending on a state of an exhaust system.

According to embodiments of the present disclosure, there is provided a technique including a first gas supply line configured to supply a first gas to a substrate in a process chamber, a first exhaust line connected to a first pump and configured to exhaust the first gas supplied to the substrate, a first valve installed at the first exhaust line, a second gas supply line configured to supply a second gas to the substrate in the process chamber, a second exhaust line connected to a second pump and configured to exhaust the second gas supplied to the substrate, a second valve installed at the second exhaust line, and a controller configured to be capable of controlling the first valve and the second valve, so as to perform a first line change processing of exhausting the first gas supplied to the substrate toward the second pump via the second exhaust line, when determining that the first exhaust line transitioned into a predetermined state.

BRIEF DESCRIPTION OF DRAWINGS

The accompanying drawings, which are incorporated in and constitute a part of the specification, illustrate embodiments of the present disclosure.

FIG. 1 is a longitudinal cross-sectional view illustrating a process furnace of a substrate processing apparatus according to some embodiments of the present disclosure.

FIG. 5A is a diagram illustrating a normal operating state, and FIG. 5B is a diagram illustrating a state after transition into a predetermined state.

FIG. 6A is a diagram illustrating a normal operating state, and FIG. 6B is a diagram illustrating a state after transition into a predetermined state.

FIG. 7 is an explanatory diagram illustrating a process operation of switching an exhaust system before maintenance of a substrate processing apparatus according to the embodiments of the present disclosure.

DETAILED DESCRIPTION

Figure 2:
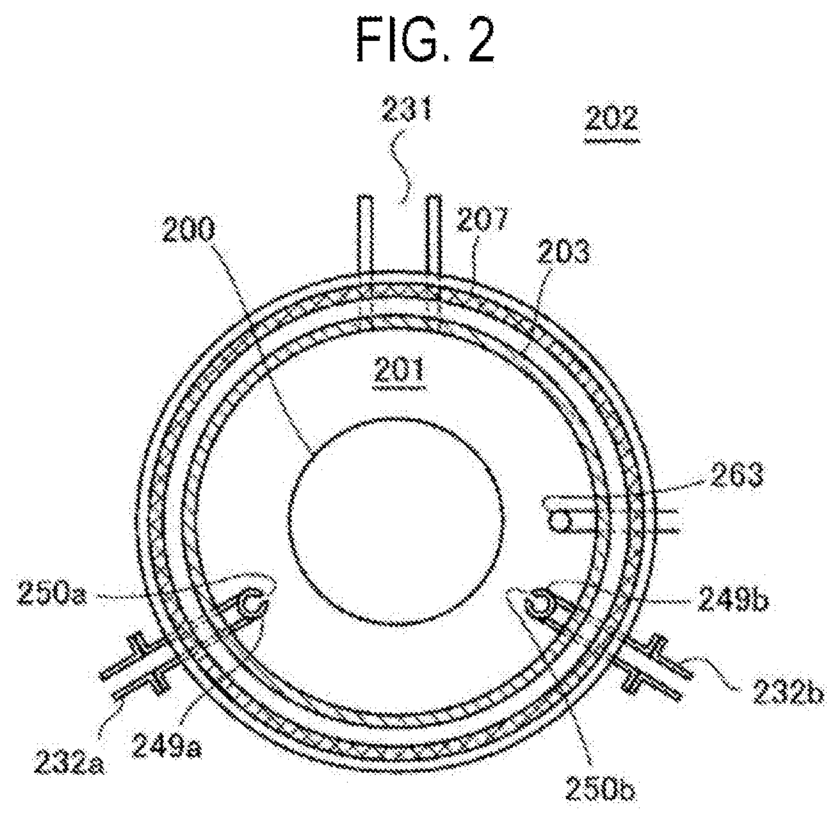
FIG. 2 is a cross-sectional view illustrating the process furnace of the substrate processing apparatus according to the embodiments of the present disclosure, and is a view of a cross section taken along line A-A of FIG. 1.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Hereinafter, some embodiments of the present disclosure will be described with reference to the accompanying drawings. In addition, the drawings used in the following description are schematic and dimensional relationships, proportions, and the like of the respective components in the drawing may not correspond to actual ones. Further, dimensional relationships, proportions, and the like of the respective components may not correspond to one another among multiple drawings.

(1) Configuration of Substrate Processing Apparatus

First, a configuration of a substrate processing apparatus according to embodiments of the present disclosure will be described.

Here, an example of a substrate processing apparatus will be described, which is used in a process of manufacturing a semiconductor device, and is a vertical batch-type apparatus configured to perform a film formation and the like on a plurality of substrates at once.

(Process Furnace)

Figure 1:
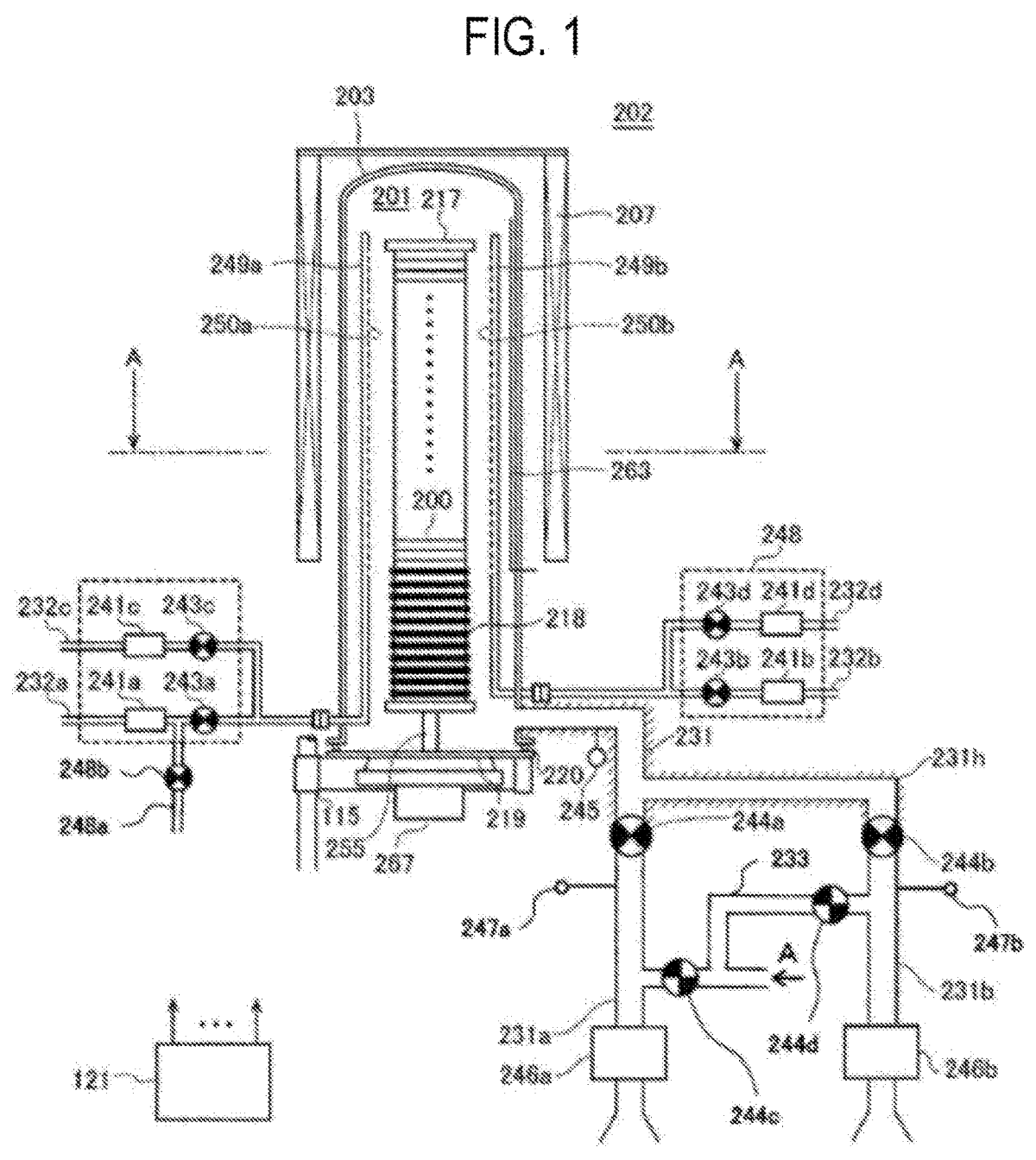

As illustrated in FIG. 1, a substrate processing apparatus according to the embodiments of the present disclosure is configured to include a process furnace 202.

The process furnace 202 includes a heater 207 as a heating means or unit (heating mechanism). The heater 207 is formed in a cylindrical shape and is mounted vertically by being supported by a holding plate. The heater 207 also functions as an activator (exciter) configured to activate (excite) a gas with heat.

A reaction tube 203 is disposed inside the heater 207 to be concentric with the heater 207 so as to configure a reaction container (process container). The reaction tube 203 is made of, for example, a heat-resistant material such as quartz ($SiO_2$) or silicon carbide (SiC) and is formed in a cylindrical shape with its upper end closed and lower end opened.

A process chamber 201 is formed in a tubular hollow area of the reaction tube 203. The process chamber 201 is configured to be capable of accommodating a wafer 200 as a substrate.

A seal cap 219, which serves as a furnace opening lid configured to be capable of airtightly sealing a lower end opening of the reaction tube 203, is installed under the reaction tube 203. The seal cap 219 is made of, for example, a metal such as SUS, and is formed in a disc shape. An O-ring 220, which is a seal making contact with the lower end of the reaction tube 203, is installed on an upper surface of the seal cap 219. A rotator 267 configured to rotate a boat 217 to be described later is installed below the seal cap 219. A rotary shaft 255 of the rotator 267 is connected to the boat 217 through the seal cap 219. The rotator 267 is configured to rotate the wafer 200 by rotating the boat 217. The seal cap 219 is configured to be moved up or down vertically by a boat elevator 115 as an elevator installed outside the reaction tube 203. The boat elevator 115 is configured as a transfer apparatus (transfer mechanism) configured to load or unload (transfer) the boat 217, i.e., the wafer 200 into or out of the process chamber 201 by moving the seal cap 219 up or down.

The boat 217 serving as a substrate support is configured to support a plurality of (e.g., 25 to 200) wafers 200 in such a state that the wafers 200 are arranged in a horizontal posture and in multiple stages along a vertical direction with centers of the wafers 200 aligned with one another. That is, the boat 217 is configured to arrange the wafers 200 in a spaced-apart relationship. The boat 217 is made of, for example, a heat-resistant material such as quartz or SiC. Heat insulating plates 218 made of, for example, a heat-resistant material such as quartz or SiC are supported in a horizontal posture and in multiple stages below the boat 217.

A temperature sensor 263 as a temperature detector is installed inside the reaction tube 203. By regulating a state of supplying electric power to the heater 207 based on temperature information detected by the temperature sensor 263, an internal temperature of the process chamber 201 falls within a desired temperature distribution. The temperature sensor 263 is installed along an inner wall of the reaction tube 203.

(Gas Supply System)

Nozzles 249*a* and 249*b* are installed inside the process chamber 201 so as to penetrate a lower sidewall of the reaction tube 203. Gas supply pipes 232*a* and 232*b* are respectively connected to the nozzles 249*a* and 249*b*.

At the gas supply pipes 232*a* and 232*b*, mass flow controllers (MFCs) 241*a* and 241*b*, which are flow rate controllers (flow rate control parts), and valves 243*a* and 243*b*, which are opening/closing valves, are installed in this order from the corresponding upstream side, respectively. Gas supply pipes 232*c* and 232*d* configured to supply an inert gas are connected to the gas supply pipes 232*a* and 232*b* at the downstream side of the valves 243*a* and 243*b*, respectively. At the gas supply pipes 232*c* and 232*d*, MFCs 241*c* and 241*d* and valves 243*c* and 243*d* are installed in this order from the corresponding upstream side, respectively.

As illustrated in FIG. 2, the nozzles 249*a* and 249*b* are respectively installed in annular space (in a plane view) between an inner wall of the reaction tube 203 and the wafers 200 to extend upward from a lower side to an upper side of the inner wall of the reaction tube 203, that is, along an arrangement direction of the wafers 200. That is, the nozzles 249*a* and 249*b* are respectively installed in a region horizontally surrounding a wafer arrangement region in which the wafers 200 are arranged at a lateral side of the wafer arrangement region, along the wafer arrangement region. Gas supply holes 250*a* and 250*b* configured to supply gases are respectively formed on side surfaces of the nozzles 249*a* and 249*b*, respectively. Each of the gas supply holes 250*a* and 250*b* is open to face a center of the reaction tube 203, thus enabling the gas to be supplied toward the wafers 200. These gas supply holes 250*a* and 250*b* are formed in a plural number from the lower side to the upper side of the reaction tube 203.

(First Gas Supply Line)

As a precursor gas which is a first gas, a halogen-based precursor gas containing a predetermined element (main element) and a halogen element is suppled from the gas supply pipe 232*a* into the process chamber 201 via the MFC 241*a*, the valve 243*a*, and the nozzle 249*a*. That is, the gas supply pipe 232*a* functions as a first gas supply line configured to supply the precursor gas, which is the first gas, to the wafers 200 in the process chamber 201.

The precursor gas is a gaseous precursor, for example, a gas obtained by vaporizing a precursor, which is in a liquid phase under normal temperature and normal pressure, or a precursor which is in a gas phase under normal temperature and normal pressure. Examples of the halogen element may include chlorine (Cl), fluorine (F), bromine (Br), and iodine (I). That is, the halogen-based precursor gas contains halogen groups such as chloro groups, fluoro groups, bromo groups, and iodine groups. As the halogen-based precursor gas, for example, a halosilane precursor gas containing silicon (Si) and Cl as the predetermined element, i.e., a chlorosilane precursor gas may be used. For example, a hexachlorodisilane ($Si_2C_6$, abbreviation: HCDS) gas may be used as the chlorosilane precursor gas. Further, in addition to the HCDS gas, a chlorosilane precursor gas containing Si—Cl bonds, such as a monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, and octachlorotrisilane ($Si_3Cl_8$, abbreviation: OCTS) gas, may be used as the precursor gas.

That is, the precursor gas, which is the first gas, is a gas containing a main constituent element (e.g., Si) constituting a film (e.g., Si-containing film) to be formed on the wafer 200. Specifically, the precursor gas, which is the first gas, is, for example, a Si-containing gas. More specifically, the precursor gas, which is the first gas, is, for example, a halosilane-based gas such as a chlorosilane-based gas.

A precursor supply system (halosilane precursor supply system) mainly includes the gas supply pipe 232*a*, the MFC 241*a*, and the valve 243*a*.

(Second Gas Supply Line)

As a reactant gas which is a second gas, a gas containing nitrogen (N) (nitriding gas or nitriding agent) is supplied from the gas supply pipe 232*b* into the process chamber 201 via the MFC 241*b*, the valve 243*b*, and the nozzle 249*b*. That is, the gas supply pipe 232*b* functions as a second gas supply line configured to supply the reactant gas, which is the second gas, to the wafers 200 in the process chamber 201.

For example, a hydrogen nitride-based gas such as an ammonia ($NH_3$) gas may be used as the nitriding agent constituting the reactant gas. Further, in addition to the $NH_3$ gas, a hydrogen nitride-based gas containing N—H bonds such as a diazene ($N_2H_2$) gas, hydrazine ($N_2H_4$) gas, and $N_3H_8$ gas may be used as the reactant gas.

That is, the reactant gas, which is the second gas, is a gas not containing the main constituent element (e.g., Si) constituting the film (e.g., Si-containing film) to be formed on the wafer 200. Specifically, the reactant gas, which is the second gas, includes, for example, at least one selected from the group of a C-containing gas such as $C_3H_6$, an O-containing gas such as $O_2$, and a N- and H-containing gas. Further, the reactant gas, which is the second gas, may include, for example, the C-containing gas, the O-containing gas, and the N- and H-containing gas.

A reactant supply system (nitriding agent supply system) mainly includes the gas supply pipe 232*b*, the MFC 241*b*, and the valve 243*b*.

(Inert Gas Supply Line)

An inert gas is supplied from the respective gas supply pipes 232*c* and 232*d* into the process chamber 201 via the MFCs 241*c* and 241*d*, the valves 243*c* and 243*d*, the gas supply pipes 232*a* and 232*b*, and the nozzles 249*a* and 249*b*, respectively. That is, the gas supply pipes 232*c* and 232*d* function as inert gas supply lines configured to supply the inert gas into the process chamber 201.

As the inert gas, for example, at least one or more selected from the group of a nitrogen ($N_2$) gas, helium (He) gas, neon (Ne) gas, argon (Ar) gas, and xenon (Xe) gas may be used.

An inert gas supply system mainly includes the gas supply pipes 232*c* and 232*d*, the MFCs 241*c* and 241*d*, and the valves 243*c* and 243*d*.

(Gas Exhaust System)

The reaction tube 203 is provided with an exhaust pipe 231 configured to exhaust the atmosphere in the process chamber 201. A pressure sensor 245 as a pressure detector (pressure detection part) configured to detect the internal pressure of the process chamber 201 is installed at the upstream side of the exhaust pipe 231. The downstream side of the exhaust pipe 231 is branched into exhaust pipes 231*a* and 231*b*.

As illustrated by oblique lines in FIG. 1, for example, a ribbon-shaped heater 231*h* is wound around an outer periphery of the exhaust pipe 231 and outer peripheries of upstream sides of the exhaust pipes 231*a* and 231*b*, and serves as a heater (heating mechanism) configured to heat these exhaust pipes.

(First Exhaust Line)

The exhaust pipe 231*a* is connected to a vacuum pump 246*a* as a first vacuum exhauster. Then, by operating the vacuum pump 246*a*, the exhaust pipe 231*a* functions as a first exhaust line configured to exhaust the precursor gas, which is the first gas, in the process chamber 201 via the exhaust pipe 231.

At the exhaust pipe 231*a*, an auto pressure controller (APC) valve 244*a* as a pressure regulator (pressure regulation part) is installed. The APC valve 244*a* functions as a first valve installed at the first exhaust line. By opening or closing the valve while the vacuum pump 246*a* is in operation, a vacuum exhaust of the interior of the process chamber 201 may be performed or stopped. Further, the internal pressure of the process chamber 201 may be regulated by adjusting an opening state of the valve based on pressure information detected by the pressure sensor 245 while the vacuum pump 246*a* is in operation.

A first exhaust system mainly includes the exhaust pipe 231, the exhaust pipe 231*a*, and the APC valve 244*a*. The vacuum pump 246*a* may be included in the first exhaust line.

Further, a first pressure gauge 247*a* may be installed at the exhaust pipe 231 on the rear end of the APC valve 244*a* (near the vacuum pump 246*a*). In this case, the first pressure gauge 247*a* may be included in the first exhaust line.

(Second Exhaust Line)

The exhaust pipe 231*b* is connected to a vacuum pump 246*b* as a second vacuum exhauster. Then, by operating the vacuum pump 246*b*, the exhaust pipe 231*b* is configured to exhaust the reactant gas supplied to the wafers 200 in the process chamber 201, via the exhaust pipe 231. That is, the exhaust pipe 231*b* functions as a second exhaust line configured to exhaust the reactant gas, which is the second gas.

At the exhaust pipe 231*b*, an APC valve 244*b* as a pressure regulator (pressure regulation part) is installed. The APC valve 244*b* functions as a second valve installed at the second exhaust line. By opening or closing the valve while the vacuum pump 246*b* is in operation, the vacuum exhaust of the interior of the process chamber 201 may be performed or stopped. Furthermore, the internal pressure of the process chamber 201 may be regulated by adjusting an opening degree of the valve based on pressure information detected by the pressure sensor 245 while the vacuum pumps 246*a* and 246*b* are in operation.

A second exhaust system mainly includes the exhaust pipe 231, the exhaust pipe 231*b*, and the APC valve 244*b*. The vacuum pump 246*b* may be included in the second exhaust line.

Further, a second pressure gauge 247*b* may be installed at the exhaust pipe 231*b* on the rear end of the APC valve 244*b* (near the vacuum pump 246*b*). In this case, the second pressure gauge 247*b* may be included in the second exhaust line.

Either or both of the first exhaust system and the second exhaust system may be referred to as an exhaust system. The pressure sensor 245 and the heater 231*h* may be included in the exhaust system.

In addition, the first exhaust system and the second exhaust system are alternately switched and used. That is, the first exhaust system is used when exhausting the atmosphere containing the precursor from the process chamber 201, whereas the second exhaust system is used when exhausting the atmosphere containing the reactant from the process chamber 201.

(Bypass Line)

A bypass line 233 is installed at the exhaust pipe 231*a* on the downstream side of the APC valve 244*a* and at the exhaust pipe 231*b* on the downstream side of the APC valve 244*b* to interconnect the exhaust pipes 231*a* and 231*b*. The bypass line 233 is connected to the exhaust pipe 231*a* via a valve 244*c* as a third valve, and is connected to the exhaust pipe 231*b* via a valve 244*d* as a fourth valve.

A branching point is provided between the valves 244*c* and 244*d* at the bypass line 233. Then, the branched end is connected to a gas source (not illustrated) via a valve 248*b* installed at a pipe 248*a* connected to the gas supply pipe 232*a*, such that a predetermined gas (herein, precursor gas) is supplied to the bypass line 233.

(Controller)

The substrate processing apparatus according to the embodiments of the present disclosure is configured to include a controller 121 as a control part (control means or unit).

Figure 3:
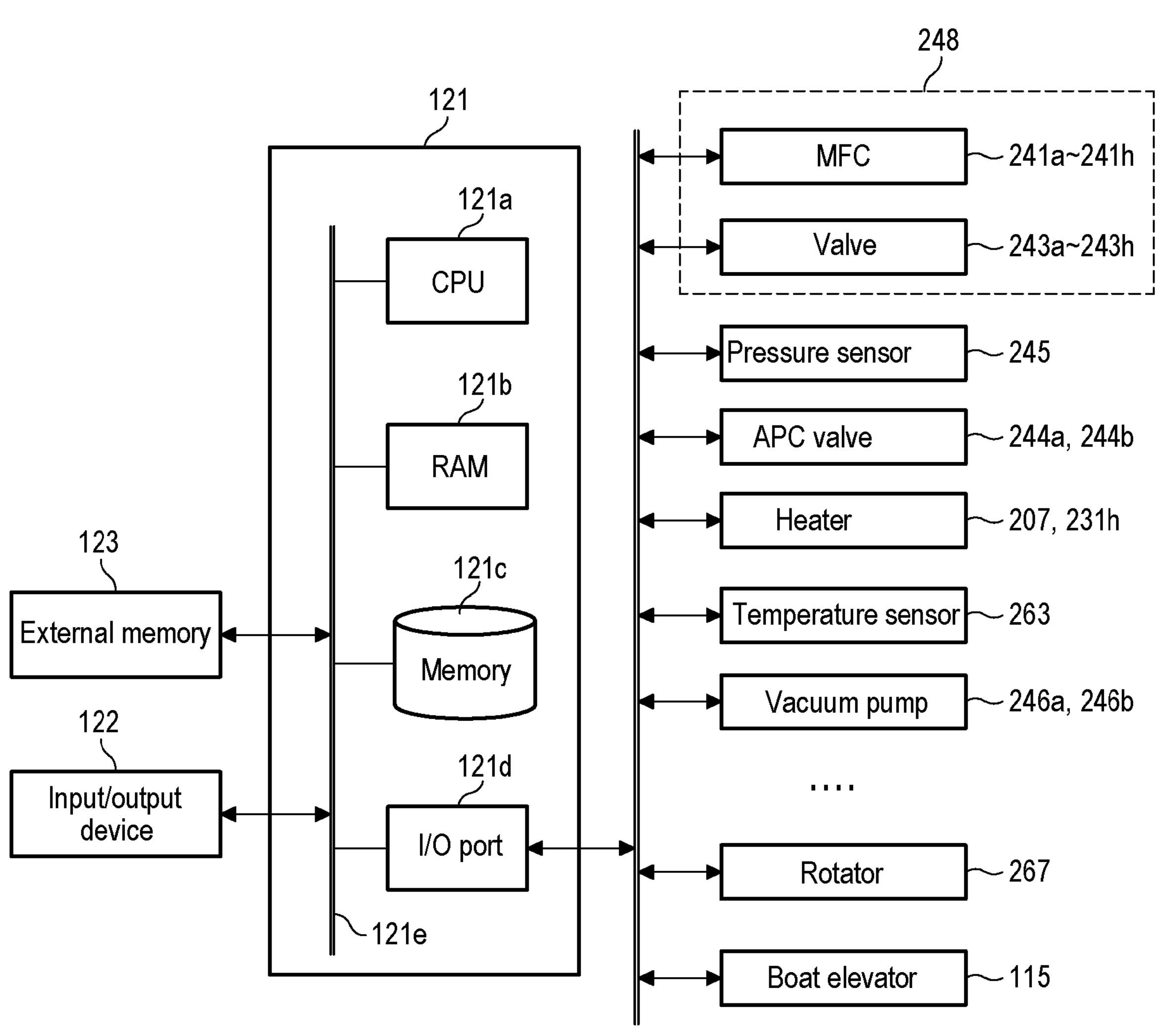
FIG. 3 is a block diagram illustrating a controller of a substrate processing apparatus according to the embodiments of the present disclosure.

As illustrated in FIG. 3, the controller 121 is configured as a computer including a central processing unit (CPU) 121*a*, a random access memory (RAM) 121*b*, a memory 121*c*, and I/O port 121*d*. The RAM 121*b*, memory 121*c*, and I/O port 121*d* are configured to be capable of exchanging data with the CPU 121*a* via an internal bus 121*e*. An input/output device 122, which is configured as, for example, a touch panel, is connected to the controller 121.

The memory 121*c* includes, for example, a flash memory and a hard disk drive (HDD). The memory 121*c* stores, in a readable manner, a control program that controls the operation of the substrate processing apparatus, a process recipe describing procedures, conditions and the like of a substrate processing process, which will be described later, and the like. The process recipe functions as a program configured to be capable of causing the controller 121 to execute each procedure in the substrate processing process, which will be described later, to obtain a predetermined result. Hereinafter, the process recipe, the control program, and the like may be generally and simply referred to as a "program." Further, the process recipe is simply referred to as a recipe. When the term "program" is used herein, it may refer to the recipe, the control program, or both of them. The RAM 121*b* is configured as a memory area (work area) in which programs, data, and the like read by the CPU 121*a* are temporarily held.

The I/O port 121*d* is connected to, for example, the above-described MFCs 241*a* to 241*h*, valves 243*a* to 243*h*, 244*c* and 244*d*, pressure sensor 245, APC valves 244*a* and 244*b*, vacuum pumps 246*a* and 246*b*, heaters 207 and 231*h*, temperature sensor 263, rotator 267, boat elevator 115.

The CPU 121*a* is configured to read and execute the control program from the memory 121*c* and to read the recipe from the memory 121*c*, for example, when an operation command is input from the input/output device 122. The CPU 121*a* is configured to be capable of controlling the flow rate regulating operation of various gases by the MFCs 241*a* to 241*h*, the opening/closing operation of the valves 243*a* to 243*h*, 244*c*, 244*d*, and 248*b*, the opening/closing operation of the APC valves 244*a* and 244*b*, the pressure regulating operation by the APC valves 244*a* and 244*b* based on the pressure sensor 245, the actuating and stopping operation of the vacuum pumps 246*a* and 246*b*, the temperature regulating operation of the heater 207 based on the temperature sensor 263, the temperature regulating operation of the heater 231*h*, the operation of rotating the boat 217 and adjusting the rotational speed of the boat 217 by the rotator 267, and the operation of moving the boat 217 up or down by the boat elevator 115, and so on, according to contents of the read recipe.

The controller 121 may be configured by installing, on the computer, the above-described program stored in an external memory (e.g., a magnetic disk such as a hard disk, an optical disc such as a CD, a magneto-optical disc such as an MO, and a semiconductor memory such as a USB memory) 123. The memory 121*c* or the external memory 123 is configured as a computer-readable recording medium. Hereinafter, the memory 121*c* and the external memory 123 are collectively referred to simply as a recording medium. When the term "recording medium" is used herein, it may refer to the memory 121*c*, the external memory 123, or both of them. In addition, the program may be provided to the computer by using a communicator such as the Internet or a dedicated line without using the external memory 123.

(Exhaust System)

The substrate processing apparatus configured as described above constitutes an exhaust system, together with the vacuum pumps 246*a* and 246*b* as the vacuum exhausters. That is, the exhaust system according to the present disclosure is configured to include the substrate processing apparatus, the vacuum pump 246*a* as the first pump, and the vacuum pump 246*b* as the second pump.

(2) Procedure of Substrate Processing Process

Next, as a process of manufacturing a semiconductor device, a procedure of forming a silicon nitride film (SiN film) on the wafer 200 as a substrate by using the substrate processing apparatus with the above-described configuration will be described. In the following description, an operation of each component of the substrate processing apparatus is controlled by the controller 121.

In addition, when the term "wafer" is used herein, it may refer to "a wafer itself," or "a stacked body (assembly) of a wafer and a certain layer or film formed on a surface of the wafer," i.e., "a wafer including a certain layer or film formed on the surface thereof." Further, when the term "a surface of a wafer" is used herein, it may refer to "a surface (exposed surface) of a wafer itself," or "a surface of a certain layer or film formed on the wafer," i.e., "an outermost surface of a wafer as a stacked body."

Accordingly, when it is stated herein "supplying a predetermined gas to a wafer," it may refer to "directly supplying a predetermined gas to a surface (exposed surface) of a wafer itself," or "supplying a predetermined gas to a layer or film formed on a wafer, i.e., to an outermost surface of a wafer as a stacked body." Further, when it is stated herein "forming a certain layer (or film) on a wafer," it may refer to "directly forming a certain layer (or film) on a surface (exposed surface) of a wafer itself," or "forming a certain layer (or film) on a layer or film formed on a wafer, i.e., on an outermost surface of a wafer as a stacked body."

Further, the term "substrate" is used herein, it may be synonymous with the term "wafer." In such a case, the "wafer" may be replaced with the "substrate" in the above description.

Hereinafter, the substrate processing process will be described.

(Wafer Charging and Boat Loading)

The boat 217 is charged with a plurality of wafers 200 (wafer charging). Thereafter, the boat 217 supporting the plurality of wafers 200 is lifted by the boat elevator 115 and is loaded into the process chamber 201 (boat loading). In this state, the seal cap 219 seals the lower end of the reaction tube 203 via the O-ring 220.

(Pressure Regulation and Temperature Regulation)

The interior of the process chamber 201, that is, a space where the wafers 200 are placed, is vacuum-exhausted (decompression-exhausted) by the first exhaust system and the second exhaust system such that an internal pressure (state of vacuum) of the process chamber 201 reaches a desired pressure (state of vacuum). At this time, the internal pressure of the process chamber 201 is measured by the pressure sensor 245, and the APC valves 244*a* and 244*b* are feedback-controlled, respectively, based on the measured pressure information. The vacuum pumps 246*a* and 246*b* are maintained in a constant operation state at least until the processing on the wafers 200 is completed.

Further, the heater 207 heats the wafers 200 in the process chamber 201 such that the wafers 200 reach a predetermined temperature (film formation temperature). At this time, a state of supplying electric power to the heater 207 is feedback-controlled based on the temperature information detected by the temperature sensor 263 such that a temperature distribution in the process chamber 201 becomes a predetermined temperature distribution. Further, the heater 231*h* is used to heat the exhaust pipe 231 and the exhaust pipes 231*a* and 231*b* at the upstream side of the APC valves 244*a* and 244*b* such that the interior of the exhaust pipe 231 and the interiors of the exhaust pipes 231*a* and 231*b* reach a predetermined temperature (a temperature at which precursor adsorption may be prevented). The above-described heating by the heaters 207 and 231*h* continues at least until the processing on the wafers 200 is completed.

Further, the rotation of the boat 217 and the wafers 200 by the rotator 267 is initiated. The rotation of the boat 217 and the wafers 200 continues at least until the processing on the wafers 200 is completed.

(Film Formation Step)

Thereafter, the following steps 1A and 2A are sequentially performed as a film formation step.

[Step 1A]

Figure 4:
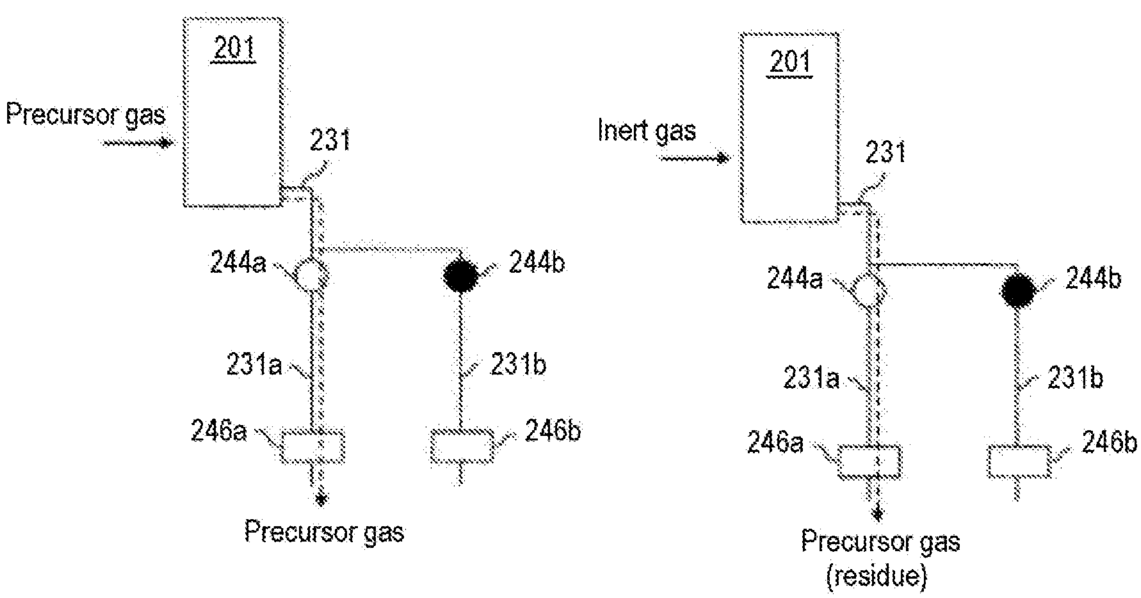
FIG. 4 is an explanatory diagram illustrating a process operation of an exhaust system of a substrate processing apparatus according to the embodiments of the present disclosure.
Figure 4:
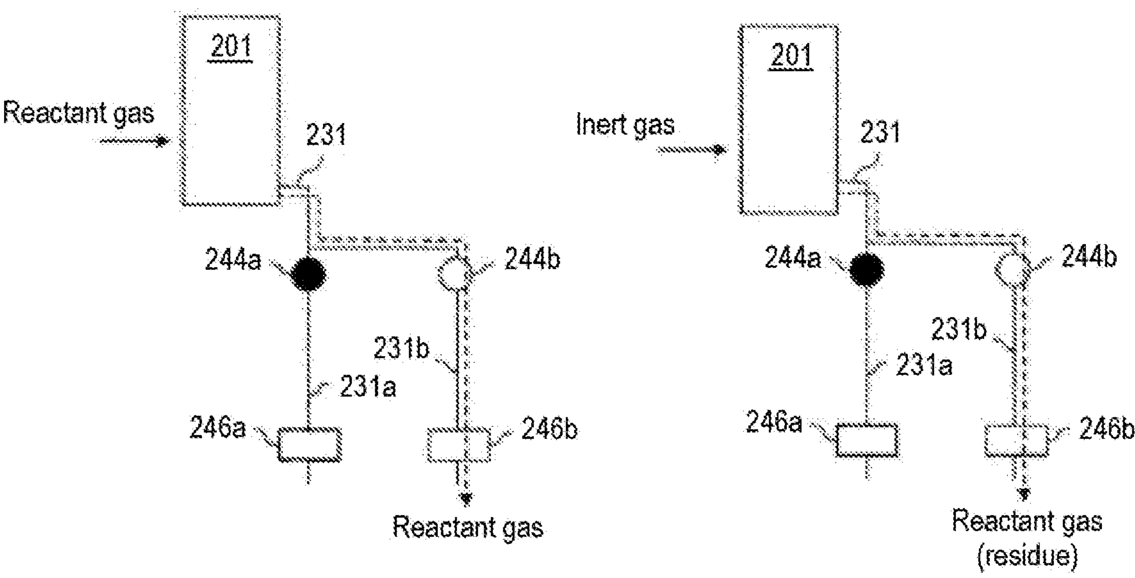

In this step, the first gas (precursor gas) is supplied to the wafer 200. Specifically, in a state in which the APC valve 244*b* is fully closed and the APC valve 244*a* is open as illustrated in the upper left side of FIG. 4, the valve 243*a* is opened to allow the precursor gas to flow through the gas supply pipe 232*a*. The precursor gas is regulated in flow rate by the MFC 241*a*, is supplied into the process chamber 201 via the nozzle 249*a*, and is exhausted via the exhaust pipe 231 from the exhaust pipe 231*a*, i.e., from the first exhaust system. At this time, the precursor gas is supplied to the wafer 200. At the same time, the valve 243*c* is opened to allow the inert gas to flow through the gas supply pipe 232*c*. The inert gas is supplied into the process chamber 201 together with the precursor gas, and is exhausted from the exhaust pipe 231*a*. Further, to prevent the precursor gas from infiltrating into the nozzle 249*b*, the valve 243*d* is opened to allow the inert gas to flow through the gas supply pipe 232*d*. The inert gas is supplied into the process chamber 201 via the gas supply pipe 232*b* and the nozzle 249*b*, and is exhausted from the exhaust pipe 231*a*.

Here, when a chlorosilane gas is used as the precursor gas, a Si-containing layer containing Cl is formed on the outermost surface of the wafer 200 by supplying the precursor gas to the wafer 200. The Si-containing layer containing Cl may be a Si layer containing Cl, may be an adsorption layer of precursor gas molecules, or may include both of them. Hereinafter, the Si-containing layer containing Cl is also simply referred to as the Si-containing layer.

Once the Si-containing layer is formed on the wafer 200, the valve 243*a* is closed to stop the supply of the precursor gas. At this time, as illustrated in the upper right side of FIG. 4, an opening/closing state of each of the APC valves 244*a* and 244*b* is maintained for a predetermined time in the same manner as that illustrated in the upper left side of FIG. 4. Thus, the precursor gas remaining in the process chamber 201 is exhausted from the first exhaust system. At this time, the valves 243*c* and 243*d* are kept open to maintain the supply of the inert gas into the process chamber 201. The inert gas acts as a purge gas, which promotes the exhaust of the residual gas (precursor gas) from the interior of the process chamber 201, the interior of the exhaust pipe 231, and the interior of the exhaust pipe 231*a*.

[Step 2A]

After step 1A is completed, the second gas (reactant gas) is supplied to the wafer 200. In this step, in a state in which the APC valve 244*a* is fully closed and the APC valve 244*b* is open as illustrated in the lower left side of FIG. 4, the opening/closing control of the valves 243*b* and 243*d* is performed in the same procedure as the opening/closing control of the valves 243*a*, 243*c*, and 243*d* in step 1A to allow the reactant gas to flow through the gas supply pipe 232*b*. The reactant gas is regulated in flow rate by the MFC 241*b*, is supplied into the process chamber 201 via the nozzle 249*b*, and is exhausted via the exhaust pipe 231 from the exhaust pipe 231*b*, i.e., from the second exhaust system. At this time, the reactant gas is supplied to the wafer 200.

Here, when a $NH_3$ gas is used as the reactant gas, at least a part of the Si-containing layer formed on the wafer 200 may be modified (nitrided) by supplying the reactant gas to the wafer 200. Thus, a layer containing Si and N, i.e., a silicon nitride layer (SiN layer) is formed on the wafer 200. When forming the SiN layer, impurities such as Cl contained in the Si-containing layer are separated from this layer in the course of the modification reaction, forming a gaseous substance containing at least Cl to be discharged from the process chamber 201. Thus, the SiN layer becomes a layer with fewer impurities such as Cl than the Si-containing layer.

Once the SiN layer is formed on the wafer 200, the valve 243*b* is closed to stop the supply of the reactant gas. At this time, as illustrated in the lower right side of FIG. 4, the opening/closing state of each of the APC valves 244*a* and 244*b* is maintained for a predetermined time in the same manner as that illustrated in the lower left side of FIG. 4. Thus, the reactant gas remaining in the process chamber 201 is exhausted from the second exhaust system. At this time, the valves 243*c* and 243*d* are kept open, which promotes the exhaust of the residual gas (reactant gas) from the interior of the process chamber 201, the interior of the exhaust pipe 231, and the interior of the exhaust pipe 231*b*.

[Predetermined Number of Times]

By performing a cycle of alternately performing the above-described steps 1A and 2A a predetermined number of times n (n is an integer of 1 or more), the precursor gas and the reactant gas flow intermittently and asynchronously a predetermined number of times into the process chamber 201. This may form a film (e.g., SiN film) with a predetermined film thickness on the wafer 200. The above-described cycle may be performed multiple times.

(After-Purge and Returning to Atmospheric Pressure)

After the formation of the SiN film on the wafer 200 is completed, the inert gas is supplied into the process chamber 201 from the respective gas supply pipes 232*c* and 232*d*, and the interior of the process chamber 201 is vacuum-exhausted by the first exhaust system and the second exhaust system. Thus, the interior of the process chamber 201 is purged with the inert gas, and the gas and reaction by-products remaining in the process chamber 201 are removed from the interior of the process chamber 201 (after-purge). Thereafter, the atmosphere in the process chamber 201 is replaced with the inert gas (inert gas replacement), and the internal pressure of the process chamber 201 is returned to normal pressure (returning to atmospheric pressure).

(Boat Unloading and Wafer Discharging)

The seal cap 219 is lowered by the boat elevator 115 to open the lower end of the reaction tube 203. Then, the processed wafer 200 is unloaded from the lower end of the reaction tube 203 to the outside of the reaction tube 203 while being supported in the boat 217 (boat unloading). The processed wafer 200 is discharged from the boat 217 (wafer discharge).

(3) Processing Operation in Case of Exhaust System Malfunction

As described above, in the substrate processing process, the first gas (precursor gas) and the second gas (reactant gas)

are supplied to the wafer 200 in the process chamber 201 to form a desired layer (e.g., SiN layer) on the wafer 200. In that case, the substrate processing apparatus includes the first exhaust system including the exhaust pipe 231*a*, which is the first exhaust line, and the second exhaust system including the exhaust pipe 231*b*, which is the second exhaust line. Then, each of the exhaust pipes 231*a* and 231*b* is formed with a vacuum pump specification as the first pump. Therefore, even when the precursor gas and the reactant gas are supplied to the wafer 200, each gas may be exhausted separately such that the precursor gas is exhausted from the first exhaust system and the reactant gas is exhausted from the second exhaust system. This makes it possible to reduce an amount of byproducts accumulated in the exhaust system, thereby extending a period until pump maintenance is performed. As a result, it becomes possible to reduce a maintenance frequency of the exhaust system.

However, even in the case of a dual pump specification, when operating the substrate processing apparatus for a long period of time, issues such as accumulation of by-products may occur, leading to deterioration in performance of the exhaust system including the exhaust line. The deterioration in performance of the exhaust system may involve at least one selected from the group of, for example, deterioration in performance of the vacuum pump, deterioration in performance of the valve, and deterioration in performance (conductance) of the exhaust pipe. In particular, the vacuum pump 246*a*, which is the first pump, is expected to be higher in failure rate than other components due to susceptibility to attachment of by-products, raising concerns about the deterioration in performance of the exhaust system caused by such failures.

The deterioration in performance of the exhaust system may become a factor that prevents desired film formation in the process chamber 201. Specifically, for example, a decrease in exhaust amount may lead to inability to exhaust the precursor gas before it undergoes decomposition in the process chamber 201, resulting in particle generation in the process chamber 201 and consequent deterioration such as deterioration in coverage. In other words, the deterioration in performance of the exhaust system may lead to deterioration in characteristics of the film formed on the wafer 200.

Therefore, in the substrate processing apparatus according to the embodiments of the present disclosure, the controller 121 monitors a state of the exhaust system. When the exhaust system transitions into a predetermined state, the controller 121 is configured to perform the following control processing. The control processing by the controller 121 will be described below. Here, the state of the exhaust system may include at least one selected from the group of an opening state of each valve, a pressure of the first exhaust line, a pressure of the second exhaust line, and a state of the pumps 246*a* and 246*b*.

(Upon Film Formation)

Figure 5A:
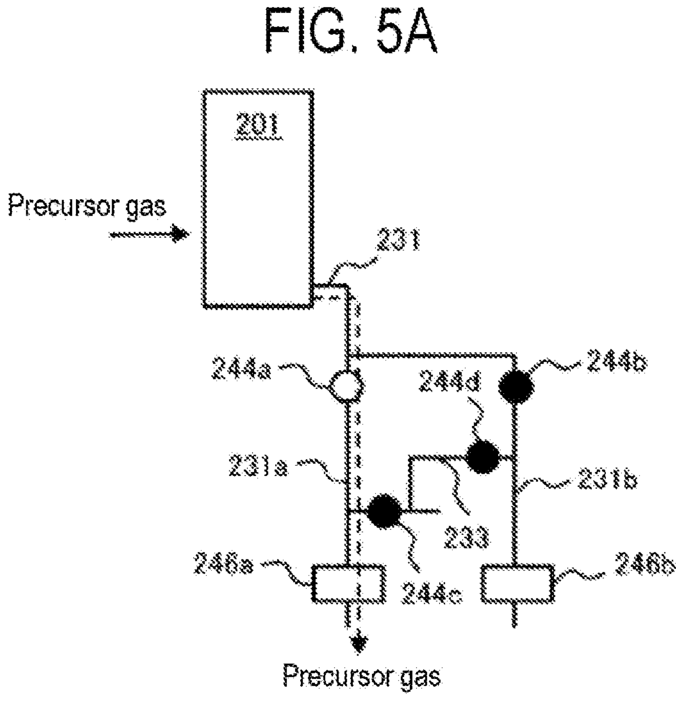
FIGS. 5A and 5B are explanatory diagrams illustrating a process operation of switching an exhaust system during film formation of a substrate processing apparatus according to the embodiments of the present disclosure.

In step 1A in the film formation step of the above-described substrate processing process, as illustrated in FIG. 5A, the controller 121 sets the APC valve 244*a* to an open state (represented by a white circle in the drawing) and the APC valve 244*b* to a fully closed state (represented by a black circle in the drawing). Further, the controller 121 sets the respective valves 244*c* and 244*d* in the bypass line 233 to a fully closed state. Thus, the precursor gas is exhausted by the first exhaust system via the exhaust pipe 231*a* as the first exhaust line when operating the vacuum pump 246*a*.

In this operation, the controller 121 monitors whether or not the exhaust pipe 231*a* as the first exhaust line is in a predetermined state. The term "predetermined state" as used herein refers to a state in which there is a high possibility of a malfunction in the exhaust conducted via the exhaust pipe 231*a*. Specifically, this may correspond, for example, to at least one state selected from the group of (i) to (v) described below.

(i) In a case where there is a decrease in exhaust amount regarding the exhaust conducted via the exhaust pipe 231*a*, the controller 121 determines that the exhaust pipe 231*a* transitioned into the predetermined state. Whether or not there is a decrease in exhaust amount may be determined, for example, by detecting a time until a power indicated by either or both of the pressure sensor 245 and the first pressure gauge 247*a* reaches a predetermined pressure based on a predefined pressure-time curve at the time of the exhaust, or by detecting that the pressure does not fall within a predetermined pressure range within a designated time. In addition, the pressure is measured by using either or both of the pressure sensor 245 and the first pressure gauge 247*a* during step 1A. In a case other than step 1A, the pressure is measured by using the first pressure gauge 247*a*.

(ii) In a case where the vacuum pump 246*a* connected to the exhaust pipe 231*a* experiences sudden stoppage, the controller 121 determines that the exhaust pipe 231*a* transitioned into the predetermined state. Whether or not there is a sudden stoppage of the vacuum pump 246*a* may be determined, for example, by the controller 121 monitoring an operating state of the vacuum pump 246*a* and detecting an alarm signal and the like from the vacuum pump 246*a*.

(iii) In a case where a load of the vacuum pump 246*a* connected to the exhaust pipe 231*a* increases, the controller 121 determines that the exhaust pipe 231*a* transitioned into the predetermined state. Whether or not the load of the vacuum pump 246*a* is increased may be determined, for example, by monitoring a load current value of the vacuum pump 246*a* and comparing the load current value with a predetermined threshold value since the load current value also increases when the load increases.

(iv) In a case where there is a valve opening malfunction of the APC valve 244*a* installed at the exhaust pipe 231*a*, the controller 121 determines that the exhaust pipe 231*a* transitioned into the predetermined state. Whether or not there is a valve opening malfunction may be determined, for example, based on a valve opening regulation signal for the APC valve 244*a* and a result of detecting the internal pressure of the process chamber 201 since, when there is the valve opening malfunction, the internal pressure of the process chamber 201 may not be regulated as desired even though a valve opening state is regulated.

In addition, the valve opening malfunction of the APC valve 244*a* may be determined by using the first pressure gauge 247*a* based on a result of detecting the internal pressure of the first exhaust pipe 231*a*. For example, when a value of the first pressure gauge 247*a* is equal to or greater than a predetermined pressure, it is determined that the APC valve 244*a* is open. Here, the predetermined pressure is a pressure of approximately 10 Pa to 100 Pa, for example. Further, in a case where the value of the first pressure gauge 247*a* is equal to or less than a predetermined pressure, it is determined that the APC valve 244*a* is closed. In this case, the predetermined pressure is, for example, approximately 0.1 Pa to 1 Pa.

(iv) In a case where there is a valve sticking of the APC valve 244*a* installed at the exhaust pipe 231*a*, the controller 121 determines that the exhaust pipe 231*a* transitioned into the predetermined state. Whether or not there is a valve sticking may be determined, for example, in the same way as the valve opening malfunction described above, or by monitoring the operating state of the APC valve 244*a* and detecting an alarm signal and the like from the APC valve 244*a*.

In a case where at least one selected from the group of (i) to (v) as described above is satisfied, the controller 121 determines that the exhaust pipe 231*a* transitioned into the predetermined state. Then, when it is determined that the exhaust pipe 231*a* transitioned into the predetermined state, the controller 121 performs a line change processing of changing a gas flow (hereinafter, referred to as a first line change processing). The first line change processing is a processing of exhausting the precursor gas supplied to the wafer 200, toward the vacuum pump 246*b* via the exhaust pipe 231*b* as the second exhaust line, rather than the exhaust pipe 231*a* as the first exhaust line. That is, the first line change processing refers to a processing of switching from the exhaust by the first exhaust system to the exhaust by the second exhaust system.

Figure 5B:
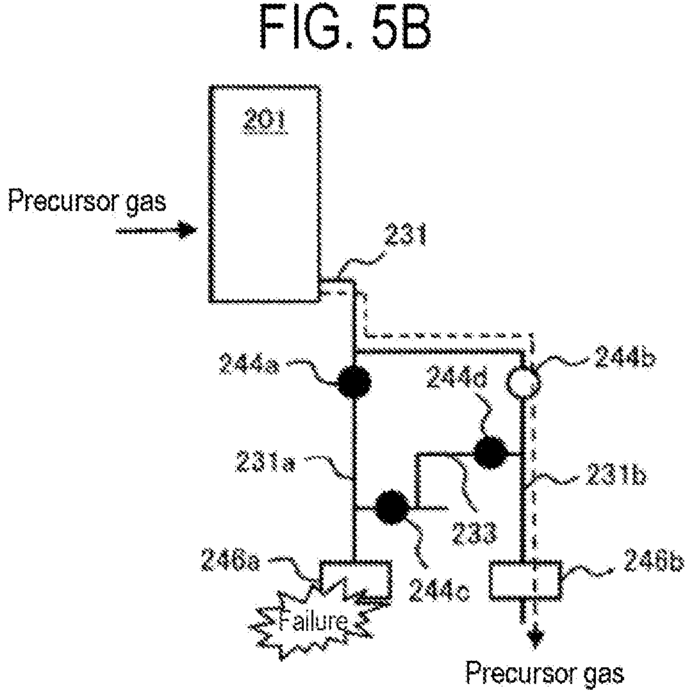

Specifically, when it is determined that the exhaust pipe 231*a* transitioned into the predetermined state, as illustrated in FIG. 5B, the controller 121 controls the operation of each of the APC valve 244*a* and the APC valve 244*b* such that the APC valve 244*a* is in a fully closed state and the APC valve 244*b* is in an open state. In this operation, the respective valves 244*c* and 244*d* in the bypass line 233 are kept in a fully closed state.

By this valve control operation, the precursor gas supplied to the wafer 200 is exhausted by the second exhaust system via the exhaust pipe 231*b* as the second exhaust line when the vacuum pump 246*b* is in operation.

Accordingly, even when the exhaust pipe 231*a* transitioned into the predetermined state (for example, when the exhaust amount decreases), by switching an exhaust path from the first exhaust system to the second exhaust system, it is possible to establish an atmosphere close to a desired film formation condition in the process chamber 201, which may prevent deterioration in characteristics of the film formed on the wafer 200.

Specifically, since in the specification of a dual pump, in a case where one pump malfunctions, it is possible to continue film formation by using the remaining pump, thus preventing a product lot-out, for example, by detecting an alarm signal generated when the vacuum pump 246*a* malfunctions and stops. That is, for example, even in a case of a sudden pump failure, it becomes possible to continue an ongoing processing on the wafer 200 by automatically switching the exhaust lines accordingly.

(Upon Use of Bypass Line)

Figure 6A:
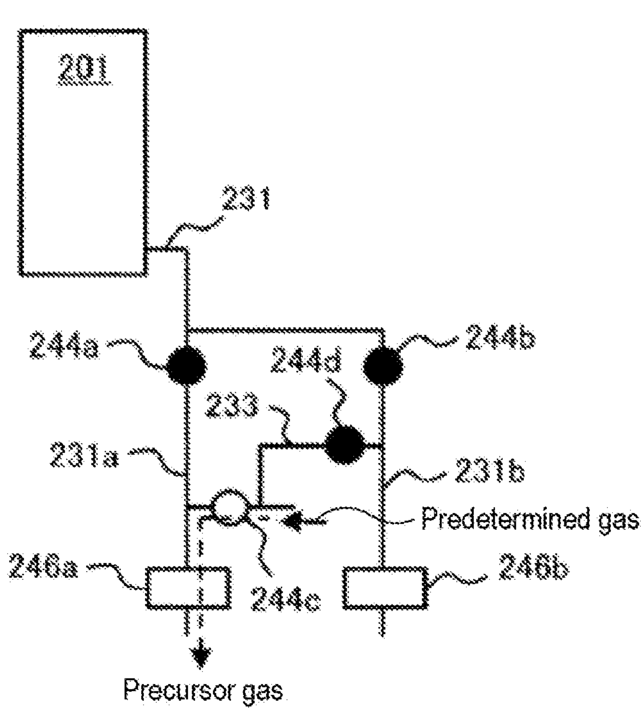
FIGS. 6A and 6B are explanatory diagrams illustrating a process operation of switching an exhaust system while using a bypass line of a substrate processing apparatus according to the embodiments of the present disclosure.

When step 1A in the film formation step of the above-described substrate processing process is completed and the precursor gas does not flow through the process chamber 201, as illustrated in FIG. 6A, the precursor gas may be supplied as a predetermined gas from the bypass line 233 to the exhaust pipe 231*a*. Specifically, the controller 121 sets the APC valve 244*a* to a fully closed state (represented by a black circle in the drawing) and the valve 244*c* in the bypass line 233 to an open state (represented by a white circle in the drawing). The controller 121 also sets the APC valve 244*b* and the valve 244*d* in the bypass line 233 to a fully closed state. Further, the controller 121 sets the valve 248*b* installed at the pipe 248*a* connected to the first gas supply line to an open state. Thus, the precursor gas present in the first gas supply line may be exhausted to the bypass line 233 via the pipe 248*a*. The precursor gas exhausted to the bypass line 233 is exhausted via the exhaust pipe 231*a* to the pump 246*a*.

At this time as well, the controller 121 performs a line change processing (hereinafter, referred to as a second line change processing) of changing the gas flow when it is determined that the exhaust pipe 231*a* transitioned into the predetermined state in the same manner as the case of normal operation described above. The second line change processing is a processing of exhausting the precursor gas in the first gas supply line toward the vacuum pump 246*b* via the bypass line 233 and the exhaust pipe 231*b* as the second exhaust line, rather than the exhaust pipe 231*a* as the first exhaust line. That is, the second line change processing refers to a processing of switching from the exhaust by the first exhaust system to the exhaust by the second exhaust system while using the bypass line 233.

Figure 6B:
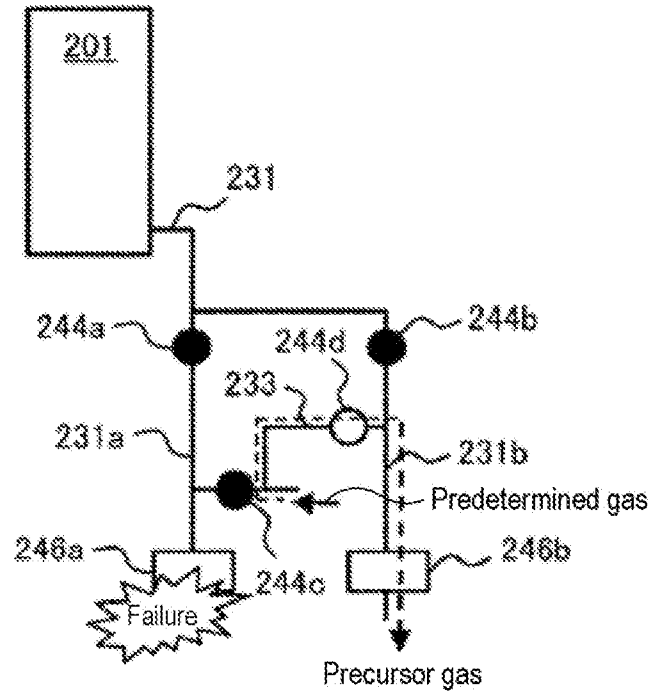

Specifically, when it is determined that the exhaust pipe 231*a* transitioned into the predetermined state, as illustrated in FIG. 6B, the controller 121 controls the operation of each of the valve 244*c* and the valve 244*d* in the bypass line 233 such that the valve 244*c* is in a fully closed state and the valve 244*d* is in an open state. In this operation, the APC valves 244*a* and 244*b* are kept in a fully closed state.

By this valve control operation, the precursor gas in the first gas supply line is exhausted by the second exhaust system via the bypass line 233 and the exhaust pipe 231*b* as the second exhaust line when the vacuum pump 246*b* is in operation.

Accordingly, even when the exhaust pipe 231*a* transitioned into the predetermined state (for example, when the exhaust amount decreases), by switching the exhaust path, it becomes possible to exhaust the precursor gas or the precursor gas changed in characteristics present in the first gas supply line, via the bypass line 233 and the exhaust pipe 231*b* without passing through the process chamber 201. This makes it possible to prevent the precursor gas changed in characteristics from being supplied to the process chamber 201 and to establish an atmosphere close to a desired film formation condition, thus effectively preventing deterioration in characteristics of the formed film. In addition, the term "the precursor gas changed in characteristics (properties)" as used herein refers to at least one selected from the group of a partially decomposed gas, an agglomerated gas, a gas differing in concentration of a precursor, and a gas differing in pressure.

(Relationship Between First Line Change Processing and Second Line Change Processing)

As described above, when it is determined that the exhaust pipe 231*a* transitioned into the predetermined state, the controller 121 controls the opening/closing operation of the APC valves 244*a* and 244*b* and the valves 244*c* and 244*d* so as to perform the first line change processing while the wafer 200 is being processed in the process chamber 201 and to perform the second line change processing after the first line change processing. That is, when the exhaust pipe 231*a* transitions into the predetermined state, the precursor gas is exhausted via the exhaust pipe 231*b* as the second exhaust line during film formation, but during bypass line purging after film formation, the residual gas including the precursor gas is exhausted via the bypass line 233 to the exhaust pipe 231*b*.

By performing the second line change processing after the first line change processing as described above, it is possible to prevent an abrupt change in the processing environment during film formation since the exhaust of the gas in the bypass line 233 is performed after film formation. The abrupt change in the processing environment refers to, for example, a situation where the precursor gas exhausted to the exhaust pipe 231*a* via the bypass line 233, flows backward toward the process chamber 201 due to certain reasons, or a situation where a precursor gas in an unexpected state enters the exhaust pipe 231*a*, affecting film formation. Accordingly, processing uniformity for each wafer 200 (for each batch) processed within the process chamber 201 may be improved.

(Before Apparatus Maintenance)

The substrate processing apparatus according to the embodiments of the present disclosure may undergo apparatus maintenance (e.g., replacement of pumps, valves, and pipes) at a timing at which the above-described substrate processing process is not being performed. To perform apparatus maintenance, the residual gas may be exhausted from the exhaust pipe 231*a* as the first exhaust line before performing the apparatus maintenance.

Therefore, the controller 121 performs the following control processing when determining that the exhaust pipe 231*a* transitioned into the predetermined state before performing the apparatus maintenance. That is, the controller 121 performs a line change processing of changing the gas flow (hereinafter, referred to as a third line change processing) when the wafer 200 is not being processed within the process chamber 201. The third line change processing is a processing of exhausting the atmosphere in the exhaust pipe 231*a* as the first exhaust line via the bypass line 233 from the exhaust pipe 231*b* as the second exhaust line.

Figure 7:
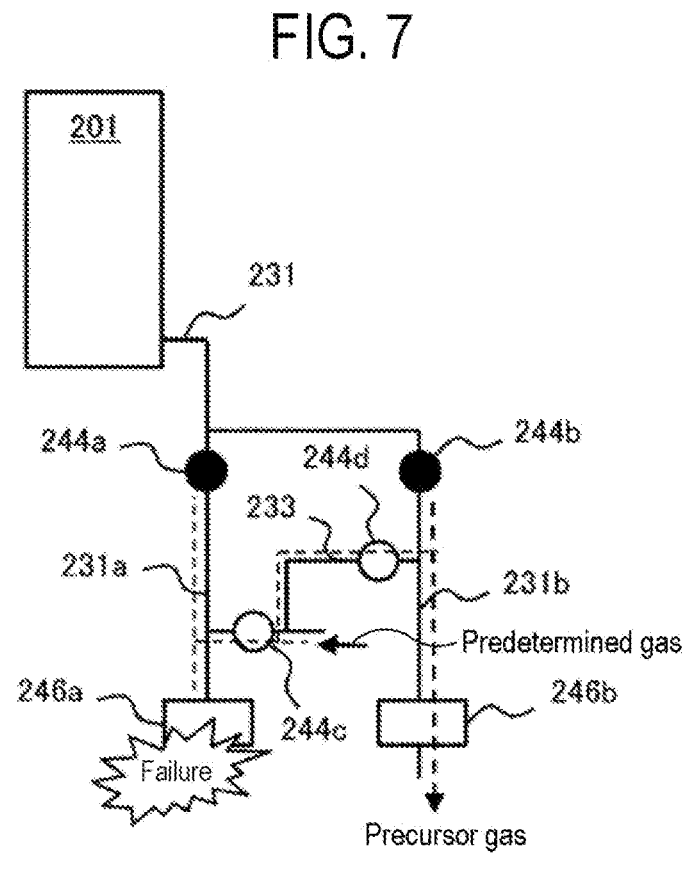

Specifically, the controller 121 controls the operation of each of the valves 244*c* and 244*d* in the bypass line 233 such that the valves 244*c* and 244*d* are in an open state, as illustrated in FIG. 7, at a timing before the apparatus maintenance at which the wafer 200 is not being processed within the process chamber 201. At this time, the APC valves 244*a* and 244*b* are in a closed state. That is, in the third line change processing, both the APC valves 244*a* and 244*b* are substantially in a closed state, whereas the respective valves 244*c* and 244*d* in the bypass line 233 are in an open state.

By this valve control operation, the atmosphere in the exhaust pipe 231*a* is exhausted by the second exhaust system via the bypass line 233 and the exhaust pipe 231*b* when the vacuum pump 246*b* is in operation.

Accordingly, even in a case where the exhaust pipe 231*a* transitioned into the predetermined state before the apparatus maintenance, it becomes possible to exhaust the atmosphere in the exhaust pipe 231*a* (for example, the residual precursor gas) via the bypass line 233 and the exhaust pipe 231*b* without passing through the process chamber 201 by switching the exhaust path. In other words, it is possible to prevent, e.g., any particles generated in the exhaust pipe 231*a* or the precursor gas changed in characteristics from entering the process chamber 201. Therefore, it is possible to prevent changes in the processing environment within the process chamber 201.

(State Transition Determination)

The above-described first line change processing, second line change processing, and third line change processing are performed in response to the transition of the exhaust pipe 231*a* into the predetermined state. Therefore, the controller 121 monitors the state of the exhaust pipe 231*a* and determines whether the exhaust pipe 231*a* transitioned into the predetermined state. Such a determination may be performed depending on whether or not at least one selected from the group of (i) to (v) is satisfied as described above, but the determination may be performed as described below.

For example, when determining the state of the exhaust pipe 231*a*, the controller 121 supplies an inert gas into the process chamber 201 via the gas supply pipes 232*c* and 232*d* as the inert gas supply lines constituting the inert gas supply system. Then, the pressure state in the exhaust pipe 231*a* when the inert gas is exhausted via the exhaust pipe 231*a*, which is the first exhaust line, is detected. As a result, in a case where the pressure state in the exhaust pipe 231*a* is out of a predefined normal state, it is determined that the exhaust pipe 231*a* transitioned into the predetermined state. Here, the internal pressure of the exhaust pipe 231*a* is measured by either or both of the pressure sensor 245 and the first pressure gauge 247*a*.

That is, the controller 121 determines, based on the supply of the inert gas from the inert gas supply line, whether the exhaust pipe 231*a* transitioned into the predetermined state. As such, in a case where the determination is made by using the supply of the inert gas, the first line change processing and the like are not performed during the supply of a process gas such as the precursor gas or the reactant gas, and as a result, unintentional film formation may be avoided.

Further, for example, the controller 121 may determine, before the supply of the first gas (precursor gas), whether the exhaust pipe 231*a* transitioned into the predetermined state. "Before the supply of the precursor gas" includes, for example, "before the start of the film formation step in the substrate processing process" and "before the supply of the precursor gas while performing one or more cycles." As such, in a case where the determination is performed before the supply of the precursor gas, the first line change processing and the like are not performed during the supply of the precursor gas, and as a result, unintentional film formation may be avoided.

Further, for example, the controller 121 may determine, between the supply of the first gas (precursor gas) and the supply of the second gas (reactant gas), whether the exhaust pipe 231*a* transitioned into the predetermined state. As such, in a case where the determination is performed between the supply of the precursor gas and the supply of the reactant gas, the first line change processing and the like are not performed during the supply of the reactant gas, and as a result, unintentional film formation may be avoided.

Further, for example, the controller 121 may determine, after the supply of the second gas (reactant gas), whether the exhaust pipe 231*a* transitioned into the predetermined state. "After the supply of the reactant gas" includes, for example, "after completion of the film formation step in the substrate processing process" and "after the supply of the reactant gas while performing one or more cycles (before the supply of the precursor gas)." As such, in a case where the determination is performed after the supply of the reactant gas, the first line change processing and the like are not performed during the supply of the reactant gas, and as a result, unintentional film formation may be avoided. Further, making the determination after film formation enables determination of whether film formation may be performed on the next wafer 200. Further, in a case where the determination is made during the cycle, it becomes possible to easily grasp that the line change processing was performed in the $N^{th}$ cycle.

(Alarm Notification)

The controller 121 performs the first line change processing and the like when determining that the exhaust pipe 231*a* transitioned into the predetermined state. At that time, the controller 121 may issue an alarm notification. That is, the controller 121 may issue an alarm notification when determining that the exhaust pipe 231*a* transitioned into the predetermined state.

The alarm notification may be made by, for example, sound output which uses a speaker, display output of light which uses a lighting, display output of characters, images, and the like which use a display screen, and output of an alarm signal to a host apparatus and the like which uses a communication line, as long as such an output may notify state transition.

By issuing the alarm notification, a user of the substrate processing apparatus which is an alarm notification target may easily and accurately recognize, for example, that substrate processing process is being performed under a condition different from a desired condition, or that the substrate processing apparatus is in an abnormal state.

In the case of issuing the alarm notification, the controller 121 may continue an ongoing processing on the wafer 200 in the process chamber 201 after issuing the alarm notification until the processing is completed. Furthermore, the controller 121 may not initiate a next substrate processing after the processing on the wafer 200 in the process chamber 201 is completed. That is, based on the alarm notification, the controller 121 completes the ongoing processing but does not initiate a new processing, and may set a hold state in which the substrate processing apparatus is stopped before the start of a recipe.

By setting the substrate processing apparatus to the hold state in response to the alarm notification as described above, the substrate processing apparatus may be stopped without initiating a next new processing, thereby preventing a substrate processing under a condition different from a desired condition in advance.

Further, in the case of issuing the alarm notification, the controller 121 may be configured to be capable of transmitting information on the wafer 200 processed after the alarm notification is issued, as well as information indicating that the alarm notification was issued, to a host apparatus by using a communication line. By enabling the transmission of information on the wafer 200 processed after the alarm notification is issued, it is easy for the host apparatus to identify factors of deterioration in yield based on the transmitted information on the wafer 200.

In addition, the controller 121 may not transmit both of the alarm notification information and the information on the wafer 200, and may be configured to transmit at least one selected from the group of the alarm notification information and the information on the wafer 200 to the host apparatus. Even in this case, the host apparatus may obtain useful information in understanding the state of the substrate processing apparatus or the processed wafer 200.

(4) Effects of the Embodiments of the Present Disclosure

According to the embodiments of the present disclosure, one or a plurality of effects described below may be obtained.

(a) According to the embodiments of the present disclosure, when it is determined that the exhaust pipe 231*a* as the first exhaust line transitioned into the predetermined state, the first line change processing is performed to exhaust the precursor gas supplied to the wafer 200, via the exhaust pipe 231*b* as the second exhaust line. Accordingly, even when the exhaust pipe 231*a* transitioned into the predetermined state, by switching the exhaust path from the first exhaust system to the second exhaust system, it is possible to establish an atmosphere close to a desired film formation condition in the process chamber 201, which may prevent deterioration in characteristics of the film formed on the wafer 200. Specifically, for example, even in the case of a sudden pump failure, it becomes possible to continue an ongoing processing on the wafer 200 by automatically switching the exhaust line accordingly.

(b) According to the embodiments of the present disclosure, when it is determined that the exhaust pipe 231*a* as the first exhaust line transitioned into the predetermined state, the second line change processing is performed to exhaust the precursor gas present in the first gas supply line, via the bypass line 233 and the exhaust pipe 231*b* as the second exhaust line. Accordingly, even when the exhaust pipe 231*a* transitioned into the predetermined state, by switching the exhaust path, it becomes possible to exhaust the precursor gas changed in characteristics present in the first gas supply line, via the bypass line 233 and the exhaust pipe 231*b* without passing through the process chamber 201. This also establishes an atmosphere close to a desired film formation condition, which is highly effective in preventing deterioration in characteristics the formed film.

(c) According to the embodiments, the first line change processing is performed while the wafer 200 is being processed in the process chamber 201, and the second line change processing is performed after the first line change processing. Accordingly, it is possible to prevent an abrupt change in the processing environment during film formation since the gas in the bypass line 233 is exhausted after film formation, which may improve the processing uniformity for each wafer 200 (for each batch) processed within the process chamber 201.

(d) According to the embodiments of the present disclosure, the third line change processing is performed to exhaust the atmosphere in the exhaust pipe 231*a* as the first exhaust line via the bypass line 233 from the exhaust pipe 231*b* as the second exhaust line when the wafer 200 is not being processed in the process chamber 201. Accordingly, even in a case where the exhaust pipe 231*a* transitioned into the predetermined state before apparatus maintenance, by switching the exhaust path, it becomes possible to exhaust the atmosphere in the exhaust pipe 231*a* (for example, the residual precursor gas) via the bypass line 233 and the exhaust pipe 231*b* without passing through the process chamber 201. That is, it is possible to prevent, e.g., any particles generated in the exhaust pipe 231*a* or the precursor gas changed in characteristics from entering the process chamber 201, and as a result, it is possible to prevent changes in the processing environment within the process chamber 201.

(e) According to the embodiments of the present disclosure, when determining the state of the exhaust pipe 231*a*, it is determined whether the exhaust pipe 231*a* transitioned into the predetermined state by supplying an inert gas into the process chamber 201 from the gas supply pipes 232*c* and 232*d* as the inert gas supply lines, and detecting the pressure state in the exhaust pipe 231*a* when exhausting the inert gas from the exhaust pipe 231*a*. As such, by determining the state of the exhaust pipe 231*a* by using the supply of the inert gas, the first line change processing and the like are not performed during the supply of a process gas such as the precursor gas or the reactant gas, and as a result, unintentional film formation may be avoided.

(f) According to the embodiments of the present disclosure, the determination of whether the exhaust pipe 231*a* transitioned into the predetermined state is made before the supply of the first gas (precursor gas). Accordingly, the first line change processing and the like are not performed during the supply of the precursor gas, and as a result, unintentional film formation may be avoided.

(g) According to the embodiments of the present disclosure, the determination of whether the exhaust pipe 231*a* transitioned into the predetermined state is made between the supply of the first gas (precursor gas) and the supply of the second gas (reactant gas). Accordingly, the first line change processing and the like are not performed during the supply of the reactant gas, and as a result, unintentional film formation may be avoided.

(h) According to the embodiments of the present disclosure, the determination of whether the exhaust pipe 231*a* transitioned into the predetermined state is made after the supply of the second gas (reactant gas). Accordingly, the first line change processing and the like are not performed during the supply of the reactant gas, and as a result, unintentional film formation may be avoided. Further, by making the determination after film formation, it becomes possible to determine whether film formation processing may be performed on the next wafer 200. Further, in a case where the determination is made during the cycle, it becomes possible to easily grasp the fact that the line change processing was performed in the $N^{th}$ cycle.

(i) According to the embodiments of the present disclosure, an alarm notification is issued in response to determination of the transition of the exhaust pipe 231*a* as the first exhaust line into the predetermined state. Accordingly, a user of the substrate processing apparatus which is an alarm notification target may easily and accurately recognize, for example, that a substrate processing is being performed under a condition different from a desired condition or that the substrate processing apparatus is in an abnormal state.

(j) According to the embodiments of the present disclosure, an ongoing processing on the wafer 200 in the process chamber 201 continues after the alarm notification is issued until the processing is completed. Then, after the processing on the wafer 200 in the process chamber 201 is completed, a next substrate processing is not initiated. Accordingly, based on the alarm notification, the ongoing process is completed, but a new processing is not initiated, resulting in a hold state in which the substrate processing apparatus is stopped before the start of a recipe. This may prevent a substrate processing from being performed under a condition different from a desired condition in advance.

(k) According to the embodiments of the present disclosure, either or both of alarm notification information and information on the wafer 200 processed after the alarm notification is issued may be transmitted to a host apparatus. Accordingly, the host apparatus may obtain useful information in grasping the state of the substrate processing apparatus or the processed wafer 200, and in particular, may easily identify factors of deterioration in yield based on the transmitted information on the wafer 200.

(l) According the embodiments of the present disclosure, the precursor gas, which is the first gas, is a gas containing a main constituent element constituting a film to be formed on the wafer 200. Specifically, the precursor gas is a Si-containing gas, and more specifically, is a halosilane-based gas such as a chlorosilane-based gas. Further, the reactant gas, which is the second gas, is a gas not containing a main constituent element constituting a film to be formed on the wafer 200. Specifically, the reactant gas includes at least one selected from the group of a C-containing gas, an O-containing gas, and a N- and H-containing gas. Further, the reactant gas, which is the second gas, may include, for example, the C-containing gas, the O-containing gas, and the N- and H-containing gas. When using these kinds of gases, there is a risk of the exhaust pipe 231*a* as the first exhaust line becoming abnormal during processing. However, by performing any processing the first line change processing and the like when the exhaust pipe 231*a* transitions into the predetermined state, it becomes possible to continue an ongoing processing on the wafer 200 even in a case where the exhaust pipe 231*a* as the first exhaust line becomes abnormal.

(m) According to the embodiments of the present disclosure, at least one selected from the group of a Si-containing gas, a C-containing gas, an O-containing gas, and a N- and H-containing gas is supplied intermittently and asynchronously into the process chamber 201. Further, the Si-containing gas, the C-containing gas, the O-containing gas, and the N- and H-containing gas may be supplied intermittently and asynchronously into the process chamber 201. Such a processing tends to increase a process time, and there is a risk of the exhaust pipe 231*a* as the first exhaust line becoming abnormal during the processing. However, by performing the first line change processing and the like when the exhaust pipe 231*a* transitions into the predetermined state, it becomes possible to continue an ongoing processing on the wafer 200 even in a case where the exhaust pipe 231*a* as the first exhaust line becomes abnormal.

(5) Modifications and the Like

Although the specific embodiments of the present disclosure are described above, the present disclosure is not limited to the above-described embodiments, and various modifications may be made without departing from the gist of the present disclosure.

For example, the above-described embodiments describe the example where the exhaust pipe 231*a* is the first exhaust line, the exhaust pipe 231*b* is the second exhaust line, the vacuum pump 246*a* is the first pump, and the vacuum pump 246*b* is the second exhaust line, but their correspondences may be reversed. That is, the controller 121 may determine whether the exhaust pipe 231*b* transitioned into the predetermined state, and may perform control to switch the exhaust system based on the determined result.

Further, there is a case where a gas containing oxygen (oxidizing agent) is added as the reactant gas, which is the second gas. As the oxidizing agent, in addition to a $H_2O$ gas, an O-containing gas containing O—H bonds such as a hydrogen peroxide ($H_2O_2$) gas, or an O-containing gas containing O—O bonds without containing O—H bonds such as oxygen ($O_2$) gas, ozone ($O_3$) gas, hydrogen ($H_2$) gas+$O_2$ gas, and $H_2$ gas+$O_3$ gas) may be used. Further, there is a case where a gas containing carbon or catalyst is added as the reactant gas, which is the second gas. As the gas containing carbon or catalyst, in addition to a pyridine gas, a cyclic amine-based gas such as aminopyridine ($C_5H_6N_2$, pKa=6.89) gas, picoline ($C_6H_7N$, pKa=6.07) gas, lutidine ($C_7H_9N$, pKa=6.96) gas, piperazine ($C_4H_{10}N_2$, pKa=9.80) gas, and piperidine ($C_5H_{11}N$, pKa=11.12) gas, or a chain amine-based gas such as triethylamine ($(C_2H_5)_3N$, abbreviation: TEA, pKa=10.7) gas, diethylamine ($(C_2H_5)_2NH$, abbreviation: DEA, pKa=10.9) gas, monoethylamine ($(C_2H_5)NH_2$, abbreviation: MEA, pKa=10.6) gas, trimethylamine ($(CH_3)_3N$, abbreviation: TMA, pKa=9.8) gas, dimethylamine ($(CH_3)_2NH$, abbreviation: DMA, pKa=10.8) gas, and monomethylamine ($(CH_3)NH_2$, abbreviation: MMA, pKa=10.6) gas may be used.

Further, the above-described embodiments described the example where film formation on the wafer 200 is performed as the substrate processing process, but the present disclosure is not limited thereto, and is applicable to another processing as long as gases are supplied and exhausted in that processing. Examples of another processing include diffusion, oxidation, nitridation, oxynitridation, reduction, oxidation-reduction, etching, heating, and the like.

Further, the above-described embodiments described the example where a batch-type substrate processing apparatus configured to process a plurality of substrates at once is used, but the present disclosure is not limited thereto, and is also suitably applicable to, for example, a single-wafer-type substrate processing apparatus configured to process one or several substrates at once. Further, the above-described embodiments describe the example where a substrate processing apparatus including a hot-wall-type process furnace is used, but the present disclosure is not limited thereto, and is also suitably applicable to, for example, a substrate processing apparatus including a cold-wall-type process furnace.

According to the present disclosure, it is possible to establish an atmosphere close to a desired process condition even when an exhaust system transitions into a predetermined state, thereby preventing characteristic deterioration of process results.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a first gas supply line configured to supply a first gas to a substrate in a process chamber;

a first exhaust line connected to a first pump and configured to exhaust the first gas supplied to the substrate;

a first valve installed at the first exhaust line;

a second gas supply line configured to supply a second gas to the substrate in the process chamber;

a second exhaust line connected to a second pump and configured to exhaust the second gas supplied to the substrate;

a second valve installed at the second exhaust line;

a bypass line connected to the first exhaust line via a third valve and connected to the second exhaust line via a fourth valve; and a controller configured to be capable of controlling the first valve and the second valve, so as to perform a first line change processing of exhausting the first gas supplied to the substrate toward the second pump via the second exhaust line, when determining that the first exhaust line transitioned into a predetermined state, wherein the controller is further configured to be capable of controlling the third valve and the fourth valve, so as to perform a second line change processing of exhausting the first gas in the first exhaust line toward the second pump via the bypass line and the second exhaust line, when determining that the first exhaust line transitioned into the predetermined state.

2. The substrate processing apparatus of claim 1, wherein the controller is further configured to be capable of controlling each of the first valve to the fourth valve, so as to perform the first line change processing while the substrate is being processed in the process chamber, and to perform the second line change processing after the first line change processing.

3. The substrate processing apparatus of claim 1, wherein the controller is further configured to be capable of controlling the third valve and the fourth valve, so as to perform a third line change processing of exhausting an atmosphere in the first exhaust line from the second exhaust line via the bypass line, with the third valve and the fourth valve in an open state, while the substrate is not being processed in the process chamber.

4. The substrate processing apparatus of claim 3, wherein the controller is further configured to be capable of controlling the first valve and the second valve such that the third line change processing is performed with both the first valve and the second valve in a substantially closed state.

5. The substrate processing apparatus of claim 1, further comprising an inert gas supply line configured to supply an inert gas into the process chamber, wherein the controller is further configured to be capable of determining whether or not the first exhaust line transitioned into the predetermined state by supplying the inert gas into the process chamber from the inert gas supply line, and then determining a pressure state in the first exhaust line when the inert gas is exhausted from the first exhaust line.

6. The substrate processing apparatus of claim 1, wherein the controller is further configured to be capable of determining, before supply of the first gas, whether or not the first exhaust line transitioned into the predetermined state.

7. The substrate processing apparatus of claim 1, wherein the controller is further configured to be capable of determining, between supply of the first gas and supply of the second gas, whether or not the first exhaust line transitioned into the predetermined state.

8. The substrate processing apparatus of claim 1, wherein the controller is further configured to be capable of determining, after supply of the second gas, whether or not the first exhaust line transitioned into the predetermined state.

9. The substrate processing apparatus of claim 1, wherein the controller is further configured to be capable of issuing an alarm notification in response to determination of transition of the first exhaust line into the predetermined state.

10. The substrate processing apparatus of claim 9, wherein the controller is further configured to be capable of continuing an ongoing processing on the substrate in the process chamber after the alarm notification until the processing is completed.

11. The substrate processing apparatus of claim 9, wherein the controller is further configured to be capable of not initiating a next substrate processing after the processing on the substrate in the process chamber is completed.

12. The substrate processing apparatus of claim 9, wherein the controller is further configured to be capable of transmitting, to a host apparatus, either or both of information on the alarm notification and information on the substrate processed in a state that the alarm notification is issued.

13. The substrate processing apparatus of claim 1, wherein the first gas is a gas containing a main constituent element constituting a film to be formed on the substrate.

14. The substrate processing apparatus of claim 1, wherein the first gas is a silicon-containing gas.

15. The substrate processing apparatus of claim 1, wherein the second gas is a gas not containing a main constituent element constituting a film to be formed on the substrate.

16. An exhaust system comprising:

the substrate processing apparatus of claim 1;

a first pump; and a second pump.

17. A method of processing a substrate, the method comprising:

supplying a first gas from a first gas supply line to the substrate in a process chamber;

exhausting the first gas supplied to the substrate, via a first exhaust line connected to a first pump;

supplying a second gas from a second gas supply line to the substrate in the process chamber;

exhausting the second gas supplied to the substrate, via a second exhaust line connected to a second pump;

controlling a first valve installed at the first exhaust line and a second valve installed at the second exhaust line, so as to exhaust the first gas supplied to the substrate toward the second pump via the second exhaust line, when it is determined that the first exhaust line transitioned into a predetermined state; and controlling a third valve and a fourth valve, so as to exhaust the first gas in the first exhaust line toward the second pump via a bypass line and the second exhaust line, when determining that the first exhaust line transitioned into the predetermined state, wherein the bypass line is connected to the first exhaust line via the third valve and is connected to the second exhaust line via the fourth valve.

18. A method of manufacturing a semiconductor device, comprising the method of claim 17.

19. A non-transitory computer-readable recording medium storing a program that causes, by a computer, a substrate processing apparatus to perform a process, the process comprising:

supplying a first gas from a first gas supply line to a substrate in a process chamber;

exhausting the first gas supplied to the substrate, via a first exhaust line connected to a first pump;

supplying a second gas from a second gas supply line to the substrate in the process chamber;

exhausting the second gas supplied to the substrate, via a second exhaust line connected to a second pump;

controlling a first valve installed at the first exhaust line and a second valve installed at the second exhaust line, so as to exhaust the first gas supplied to the substrate, toward the second pump via the second exhaust line, when it is determined that the first exhaust line transitioned into a predetermined state; and controlling a third valve and a fourth valve, so as to exhaust the first gas in the first exhaust line toward the second pump via a bypass line and the second exhaust line, when determining that the first exhaust line transitioned into the predetermined state, wherein the bypass line is connected to the first exhaust line via the third valve and is connected to the second exhaust line via the fourth valve.

* * * * *